US006534194B2

United States Patent
Weihs et al.

(10) Patent No.: US 6,534,194 B2
(45) Date of Patent: Mar. 18, 2003

(54) METHOD OF MAKING REACTIVE MULTILAYER FOIL AND RESULTING PRODUCT

(75) Inventors: Timothy P. Weihs, Baltimore, MD (US); Michael Reiss, Baltimore, MD (US)

(73) Assignee: Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/846,447

(22) Filed: May 1, 2001

(65) Prior Publication Data

US 2001/0038029 A1 Nov. 8, 2001

Related U.S. Application Data

(60) Provisional application No. 60/201,292, filed on May 2, 2000.

(51) Int. Cl.$^7$ .......................... B32B 15/00; B32B 33/00; B23K 20/08
(52) U.S. Cl. ........................ 428/635; 29/515; 29/517; 72/700; 228/107; 228/115; 228/117; 228/121; 228/126; 228/175; 228/198; 228/208; 228/212; 228/213; 228/225; 228/226; 228/234.3; 228/245; 228/246; 228/247; 228/249; 228/252; 228/902; 428/548; 428/553; 428/554; 428/555; 428/557; 428/577; 428/596; 428/607; 428/609; 428/615; 428/629; 428/652; 428/662; 428/674; 428/680; 428/469; 428/940

(58) Field of Search ................... 428/635, 548, 428/553, 554, 555, 557, 577, 596, 607, 609, 615, 629, 652, 662, 674, 680, 469, 940; 228/107, 115, 117, 121, 126, 175, 198, 208, 212, 213, 225, 226, 234.3, 245, 246, 247, 249, 252, 902; 29/515, 517; 72/700

(56) References Cited

U.S. PATENT DOCUMENTS 5,381,944 A * 1/1995 Makowiecki et al. ..... 228/234.3

OTHER PUBLICATIONS

L. Battezzatti, et al., "Acta Materialia," vol. 47, pp. 1901–1914 (1999); no month given.*

* cited by examiner

Primary Examiner—Robert R. Koehler
(74) Attorney, Agent, or Firm—Lowenstein Sandler PC

(57) ABSTRACT

In accordance with the invention a reactive multilayer foil is fabricated by providing an assembly (stack or multilayer) of reactive layers, inserting the assembly into a jacket, deforming the jacketed assembly to reduce its cross sectional area, flattening the jacketed assembly into a sheet, and then removing the jacket. Advantageously, the assembly is wound into a cylinder before insertion into the jacket, and the jacketed assembly is cooled to a temperature below 100° C. during deforming. The resulting multilayer foil is advantageous as a freestanding reactive foil for use in bonding, ignition or propulsion.

32 Claims, 6 Drawing Sheets

METHOD OF MAKING REACTIVE MULTILAYER FOIL AND RESULTING PRODUCT

CROSS REFERENCE TO RELATED APPLICATIONS

This application claims the benefit under 35 U.S.C. Section 119(e) of U.S. Provisional Application Serial No. 60/201,292 filed by T. P. Weihs et al. on May 2, 2000 and entitled "Reactive Multilayer Foils." It is related to U.S. application Ser. No. 846,486 filed by T. P. Weihs et al. concurrently herewith and entitled "Freestanding Reactive Foil" and U.S. application Ser. No. 846,422 filed by T. P. Weihs et al. concurrently herewith and entitled "Reactive Multilayer Structures for Ease of Processing and Enhanced Ductility." These three related applications are incorporated herein by reference.

GOVERNMENT INTEREST

This invention was made with government support under NSF Grant Nos. DMR-9702546 and DMR-9632526, The Army Research Lab/Advanced Materials Characterization Program through Award No. 019620047. The government has certain rights in the invention.

FIELD OF THE INVENTION

This invention relates to reactive multilayer foils, and, in particular, to a method of making such foils using plastic deformation.

BACKGROUND OF THE INVENTION

Reactive multilayer coatings are useful in a wide variety of applications requiring the generation of intense, controlled amounts of heat in a planar region. Such structures conventionally comprise a succession of substrate-supported coatings that, upon appropriate excitation, undergo an exothermic chemical reaction that spreads across the area covered by the layers generating precisely controlled amounts of heat. While we will describe these reactive coatings primarily as sources of heat for welding, soldering or brazing, they can also be used in other applications requiring controlled local generation of heat such as propulsion and ignition.

In almost every industry, improvements in bonding are becoming increasingly important as technology advances. This is especially true as the bodies to be bonded become smaller and more fragile. Additionally, new materials are often difficult to bond and have presented many problems to industry.

Many methods of bonding require a heat source. The heat source may be external or internal to the structure to be joined. An external source is typically a furnace that heats the entire unit to be bonded, including the bodies (bulk materials) to be joined and the joining material. An external heat source often presents problems because the bulk materials can be sensitive to the high temperatures required for joining. They can also be damaged by the mismatch in thermal contractions.

Internal heat sources often take the form of reactive powder. Reactive powders are typically mixtures of metals or compounds that will react exothermically to form a final compound or alloy. Such powders, developed in the early 1960s, fostered bonding by Self-Propagating, High-Temperature Synthesis (SHS). However, the energy released and the diffusion of the energy are often difficult to control in SHS reactions. As a result, bonding by powders may be unreliable or insufficient.

Reactive multilayer structure, which were subsequently developed, reduced the problems associated with reactive powder bonding. These structures are comprised of thin coatings that undergo exothermic reactions. See, for example, T. P. Weihs, *Handbook of Thin Film Process Technology*, Part B, Section F.7, edited by D. A. Glocker and S. I. Shah (IOP Publishing, 1998); U.S. Pat. No. 5,538,795 issued to Barbee, Jr. et al. on Jul. 23, 1996; and U.S. Pat. No. 5,381,944 to D. M. Makowiecki et al. on Jan. 17, 1995. Reactive multilayer structures permit exothermic reactions with more controllable and consistent heat generation. The basic driving force behind such reactions is a reduction in atomic bond energy. When the series of reactive layers is ignited, the distinct layers mix atomically, generating heat locally. This heat ignites adjacent regions of the structure, thereby permitting the reaction to travel the entire length of the structure, generating heat until all the material is reacted.

However, even with this advance, many problems remain. For example, reactive coatings often debond from their substrates upon reaction. This debonding is caused by inherent reactive foil densification during reaction and by non-uniform thermal expansion or contraction during heating and cooling. It significantly weakens the bond in joining applications. More significantly, current reactive multilayer foils yield brittle intermetallic compounds that have limited ductility and therefore can degrade the resultant joints by their presence between the bonded components. Consequently, internal or external stresses can cause catastrophic mechanical failure of the bonds.

In addition to reactive coatings, efforts were made to develop freestanding reactive layers by cold rolling. See L. Battezzatti et al, *Acta Materialia*, Vol. 47, pp. 1901–1914 (1999). Ni—Al multilayer reactive foils were formed by cold-rolling bilayer sheets of Ni and Al, followed by repeated manual folding and repeated cold rolling. After the first bilayer strip was rolled to half its original thickness, it was folded once to regain its original thickness and to double the number of layers. This process was repeated many times.

This fabrication of the rolled foils was time consuming and difficult. The rolling passes require lubricating oil, and the surfaces of the rolled materials must be cleaned after every pass. In addition, the manual folding of sheet stock does not easily lend itself to large-scale production. Starting with a stack of metallic sheets and then rolling and folding a few times would simplify the process. However, when many metal layers are rolled at once, these layers can spring back, causing separation of the layers and degradation of the resulting foil. Such separation also permits undesirable oxidation of interlayer surfaces and impedes unification of the layers by cold welding.

Accordingly, there is a need for improved methods of fabricating reactive multilayer foil.

SUMMARY OF THE INVENTION

In accordance with the invention a reactive multilayer foil is fabricated by providing an assembly (stack or multilayer) of reactive layers, inserting the assembly into a jacket, deforming the jacketed assembly to reduce its cross sectional area, flattening the jacketed assembly into a sheet, and then removing the jacket. Advantageously, the assembly is wound into a cylinder before insertion into the jacket, and the jacketed assembly is cooled to a temperature below 100° C. and preferably below 25° C. during deforming. The resulting multilayer foil is advantageous as a freestanding reactive foil for use in bonding, ignition or propulsion.

BRIEF DESCRIPTION OF THE DRAWINGS

The nature, advantages and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
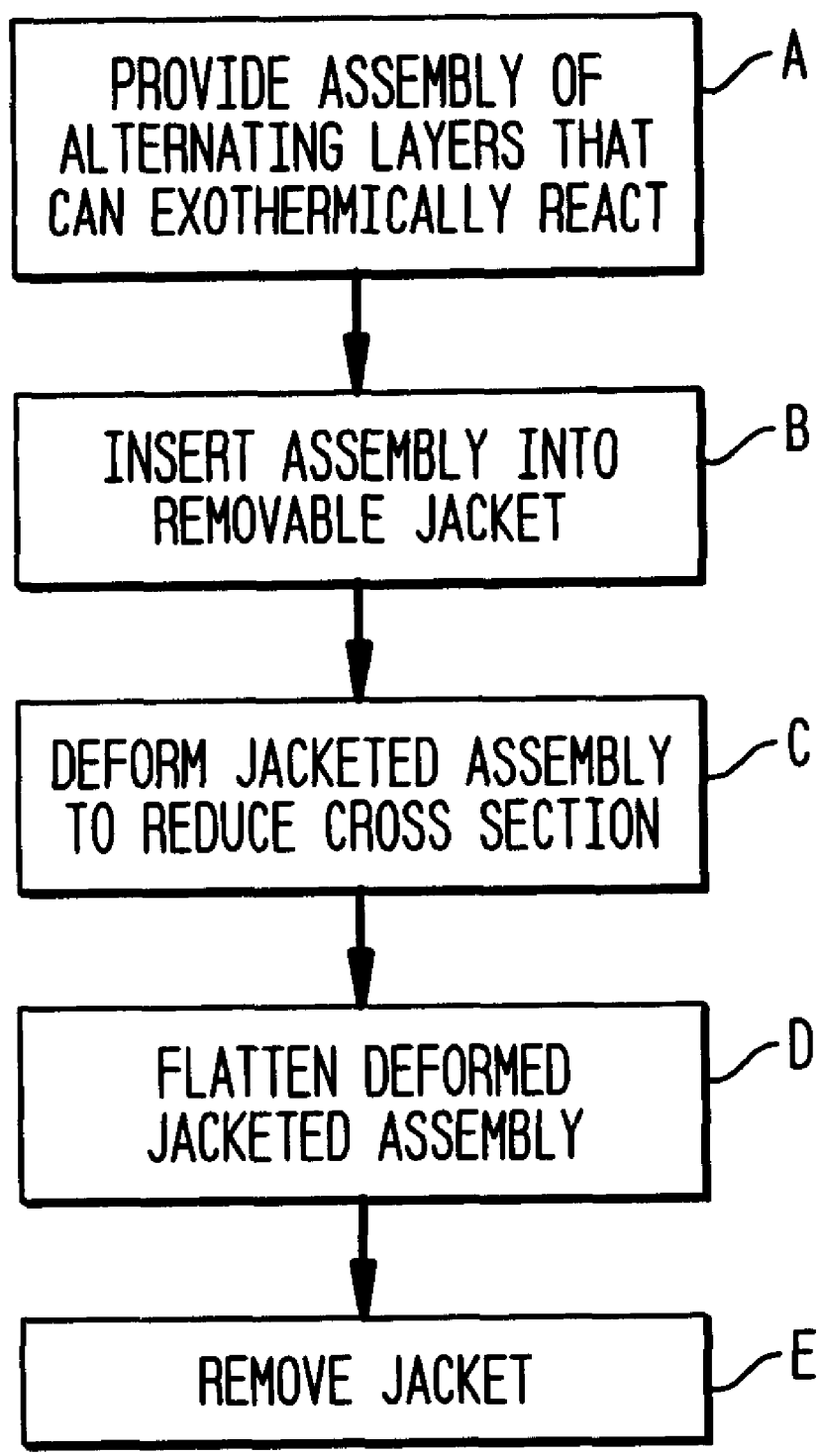
FIG. 1 is a schematic flow diagram of a method of fabricating a multilayer reactive foil in accordance with the invention.

Referring to the drawings, FIG. 1 is a schematic flow diagram illustrating the steps in fabricating a reactive multilayer foil in accordance with the invention. The first step, shown in Block A of FIG. 1, is to provide an assembly (a stack or a multilayer) of alternating layers of materials that can exothermically react, e.g. an assembly of alternating layers of Ni or nickel alloy foil and Al or Al alloy foil. The term "stack" as used herein refers to an assembly of unbonded layers. The term "multilayer" refers to an assembly of layers that have been joined together, as by cold welding. The assembly can comprise alternating layers of metals or alloys. The stack of alternating layers can also include particles of reactants.

Figure 2:
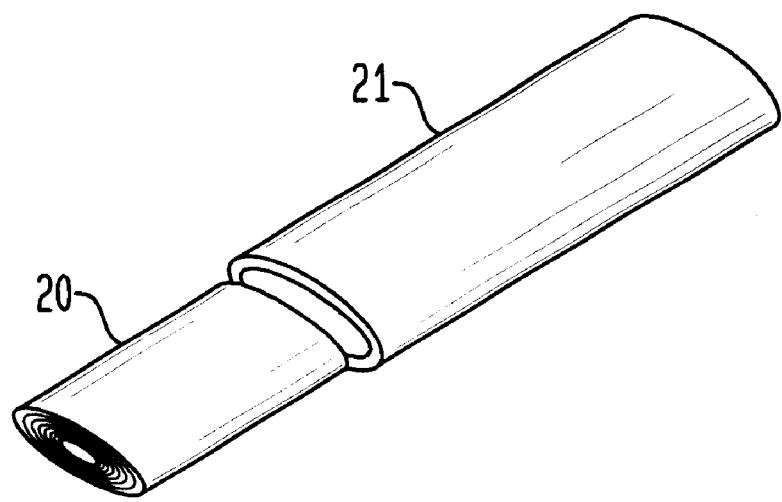
FIG. 2 illustrates insertion of a flat assembly into a jacket.
Figure 3:
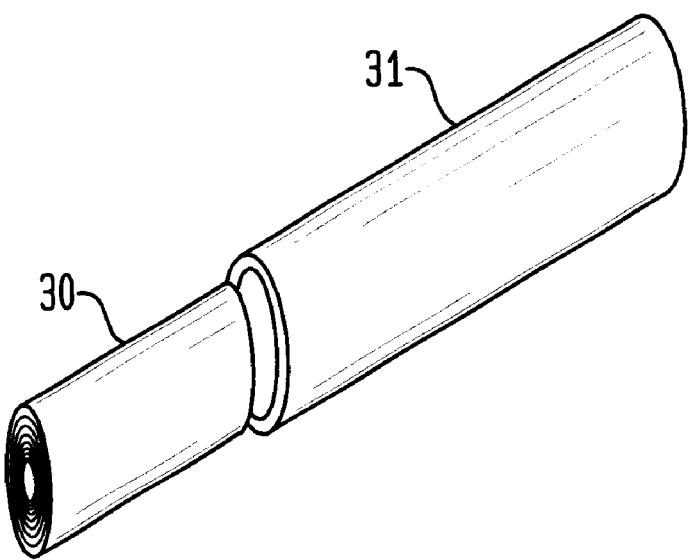
FIG. 3 shows insertion of a cylindrical assembly.

The next step, shown in Block B, is to insert the assembly into a jacket. The jacket can comprise metal or alloy. This can be done in a variety of ways. For example, as shown in FIG. 2, a flat assembly 20 can be inserted in a flattened tubular jacket 21. The flat assembly 20 can be a stack of alternating layers or a flattened cylinder of alternating layers. Alternatively, as shown in FIG. 3, a flat assembly can be wound into a cylinder 30 and inserted into a tubular jacket 31. The jacket 31 should be easily removable without damaging the materials of the assembly, e.g. a tube of copper can be etched much faster in nitric acid than either Ni or Al.

The third step (Block C) is deforming the jacketed assembly to reduce its cross-sectional area. If a cylindrical assembly is inserted in a tubular jacket, the preferred deforming can be by swaging. The size reduction in swaging comes from the hammering action of mating tapered dies into which the jacket is inserted and compressed from all sides. Swaging offers three advantages over rolling. The first is the ability to radially compress the jacketed cylinder. This symmetrical loading of the rolled foil minimizes the separation of layers caused by spring-back as seen in rolling. The second and main advantage is that deformation is three dimensional and therefore provides more extension than in rolling where deformation is just two dimensional. The third advantage relates to the second advantage. In rolling, reducing the thickness of component by a factor of two results in a 2× decrease in bilayer thickness and a 2× increase in its length. Reducing the diameter of a tube by a factor of 2, though, results in a reduction of the effective bilayer thickness that is greater than 2× and a 4× increase in length, because the cross-sectional area has been reduced by 4×. The jacketed assembly should be maintained below 100° C. and preferably below 25° C. during the deformation.

The next step (Block D) is to flatten the jacketed assembly, as by roll flattening the swage-deformed material into a planar geometry. Additional cold rolling may be applied to further reduce the bilayer thickness for ease of ignition and enhanced kinetics. The assembly should be maintained below 100° C. and preferably below 25° C. during the flattening. The jacket material is then removed as by chemical etching, shearing or clipping the edges of the jacket, thus freeing the reactive multilayer sheet.

The following example illustrates the advantage of the method of FIG. 1. Consider attempting to cold roll a Ni/Al multilayer foil. If the desired reactive foil has a total thickness of 1 mm and a bilayer period of 0.250 microns, one would prefer to start the mechanical processing with relatively thin foils of Ni and Al, to limit the degree of rolling that is required to reduce the initial bilayer period to 0.250 microns. However, an initial bilayer period smaller than 25 microns requires Ni and Al foils that are very expensive and it will also require a stack with thousands of individual foils. For example, to achieve the desired final product, an initial stack of foils with a 25 micron bilayer period, 4000 bilayers, and a total thickness of 10 cm, would require a reduction in thickness by a factor of 100 to a total thickness of 1 mm. The handling and mechanical processing of such a stack is very difficult given the large number of layers, especially since the temperature of the material needs to be kept close to room temperature to prevent atomic intermixing between the layers.

A more efficient and effective means for accomplishing the same goal is to swage a cylindrically wound bilayer stack with a 3.5 cm diameter (in a Cu jacket) and reduce its diameter to 0.5 cm, thereby reducing the effective bilayer period by a factor between $(3.5/0.5)2=49$ and 7. The resulting 0.5 cm rod can then be easily roll flattened by a factor of ~2 to 14 to the required 1 mm thick reactive ribbon. Such swaging is relatively simple and easily accomplished. Although this technique yields some non-uniformity across the width of the ribbon after it is flattened, the variation is limited to the outer edges, which can easily be removed if desired. The desired amount of swaging deformation is a 30% to 99% reduction in cross-sectional area and preferably a 60% to 95% reduction. Instead of swaging one can also reduce the area by rod rolling, rod drawing, or extrusion. The reduction of the area in this fashion will typically cold-weld the layers together into a multilayer.

The process of FIG. 1 is economically advantageous and produces high quality reactive foils useful in a wide variety of applications. The process is cheaper and faster than vapor deposition. It uses simpler equipment, cheaper raw materials and is easily adaptable to mass production. It also permits economical fabrication of very thick foils (thickness in excess of 500 micrometers) which would be very expensive to make by conventional vapor deposition.

Figure 4:
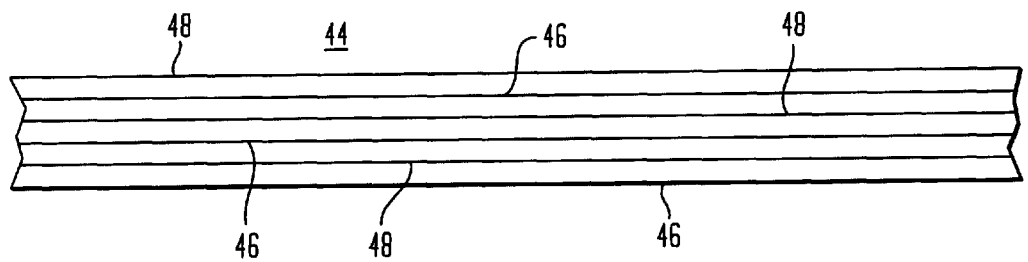
FIG. 4 illustrates a freestanding multilayer reactive foil made by the process of FIG. 1.

As illustrated in FIG. 4, the reactive foil 44 made by the process of FIG. 1 is a freestanding multilayer reactive foil for particular use as a heat-generating source. It comprises a succession of alternating layers of a first material 46 and a second material 48 that can exothermically react with the first material. Freestanding foils are easier to characterize than thin films because they can be handled like "bulk" samples. Making reactive foils 44 freestanding greatly expands their possible uses. Because such reactive foils are not necessarily associated with any particular application, they may be mass-produced for any purpose requiring a self-propagating localized heat source. Their production is not limited or impeded by placing large or delicate items into a vacuum chamber to be coated by a reactive multilayer foil. Moreover, freestanding foils permit minimization of unwanted heat sinking to the substrate.

Figure 5:
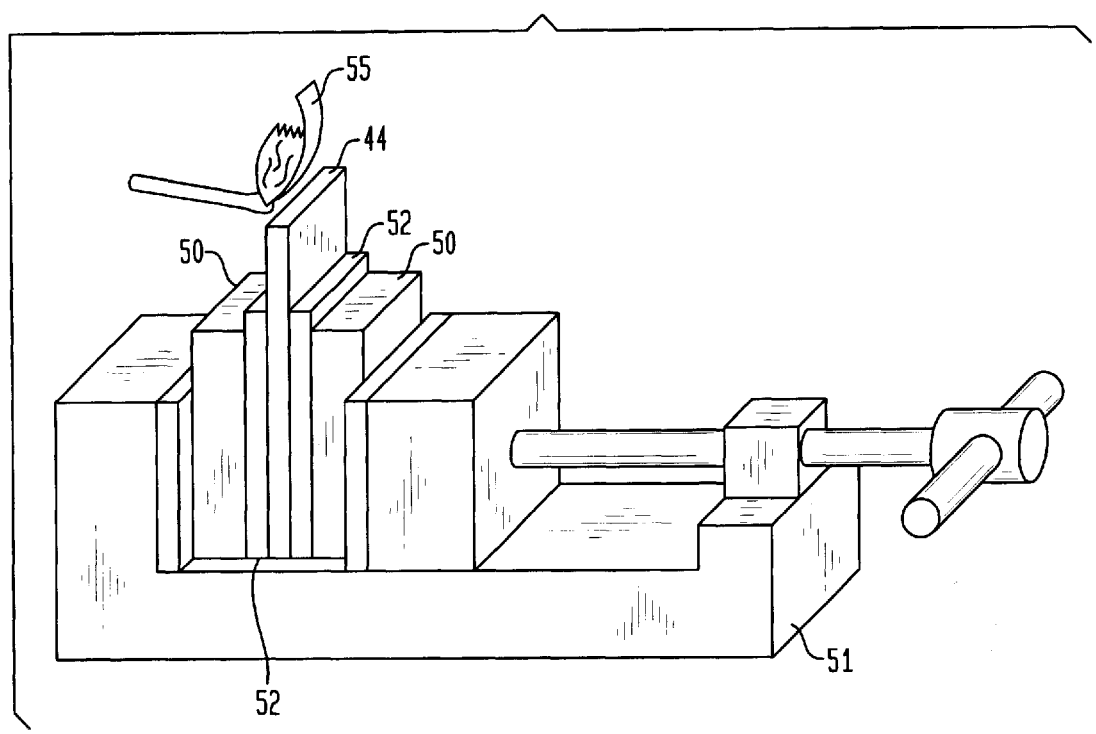
FIG. 5 schematically illustrates an exemplary joining process.

Freestanding foils made in accordance with the method of FIG. 1 may be adapted for use in a variety of applications including bonding, ignition and propulsion. For example, the freestanding foils may be used to couple bodies of materials (referred to herein as "bulk materials") together to form a unified product. Freestanding foils may find use in any number of bonding, soldering, brazing, welding or other applications to join bulk materials. A typical joining application is represented in FIG. 5, in which two or more bulk materials 50 are to be joined together. The bulk materials 50 may be ceramics, metallic glasses, metals/alloys, polymers, composites, semiconductors, and other forms of material. In FIG. 5, joining material 52 is used to join bulk materials 50 together. Joining material 52 may be any layer (or composite layer) of material to be melted to join bulk materials 50 together. Joining material 52 can be in the form of free-standing sheets made up of metallic glasses, metals/alloys, functionally graded layers, Ni—B films, solders, brazes, self-propagating brazes, combinations of such, or other like joining materials.

In accordance with a preferred embodiment of the invention, a reactive foil 44 is positioned between joining materials 52 to form a structure somewhat like a sandwich. The reactive foil "sandwich" thus formed is preferably positioned between bulk materials 50 at the location (e.g., end point, joint, intersection, etc.) at which the bulk materials 50 are to be joined together. Alternatively, the reactive foil 44 is positioned between bulk materials 50, which have previously been coated with joining materials 52.

The joining process involves the application of force (as symbolically represented by vice 51 in FIG. 5) to maintain the relative positions of bulk materials 50, joining materials 52, and reactive foil 44. Advantageously all components are freestanding elements pressed together. In an alternative embodiment, joining materials 52 are presented as a composite with reactive foil 44.

Once the components of the joining process are positioned, a stimulus (shown as lighted match 55) is applied, preferably, to one end of reactive foil 44 to initiate a multilayer reaction. The intermixing of atoms within reactive foil 44 produces rapid and intense heat sufficient to melt joining materials 52 along the entire length of reactive foil 44. In this state, joining materials 52 join bulk materials 50 together. Shortly thereafter, the joined bulk materials 50 return to the temperature of the environment (e.g., room temperature) and can be removed from the applied force.

A composite structure composed of joining materials 52 and reactive foil 44 can be formed through deposition (e.g., vapor depositing) or mechanical force (e.g., cold rolling) of joining material 52 onto one side of reactive foil 44. Another layer of joining material is then combined with reactive foil 44 through vapor deposition or mechanical force on the second side of reactive foil 44.

Advantageously a wetting/adhesion layer may be added to facilitate surface wetting for the reactive foil 44, bulk materials 50, or both. The wetting/adhesion layer allows uniform spreading of joining material to ensure consistent joining of bulk materials. The wetting/adhesion layer may be a thin layer of joining material (e.g., braze), Ti, Sn, metallic glass, etc. Commercial alloys such as Ag—Sn, Ag—Cu—Ti, Cu—Ti, Au—Sn, and Ni—B may also be used.

Preferred embodiments of the invention are useable as freestanding reactive foils 44 with increased total thickness. The total thickness of such a reactive foil depends upon the thickness and number of the elemental layers utilized to form the foils. Foils that are less than 10 μm are very hard to handle as they tend to curl up on themselves. Foils on the order of 100 μm are stiff, and thus, easily handled. Thicker foils also minimize the risk of a self-propagating reaction being quenched in the foils. In joining applications using reactive foils, there is a critical balance between the rate at which the foil generates heat and the rate at which that heat is conducted into the surrounding braze layers and the joint to be formed. If heat is conducted away faster than it is generated, the reaction will be quenched and the joint cannot be formed. The thicker foils make it harder to quench the reaction because there is a larger volume generating heat for the same surface area through which heat is lost.

Thicker foils can be utilized with reaction temperatures that are lower, generally leading to more stable foils. Foils with high formation reaction temperatures are generally unstable and brittle and therefore are dangerous and difficult to use. Brittle foils, for example, will crack easily, leading to local hot spots (through the release of elastic strain energy and friction) that ignite the foil. Cutting such brittle foils (e.g., for specific joint sizes) is very difficult to do as they are more likely to crack into unusable pieces or igniting during the cutting process. Freestanding thick foils offer the advantage of overcoming the previously described problems of thermal shock and densification that have plagued conventional processes. Both phenomena relate to rapid changes in the dimensions of the foils. On reacting, conventional foils heat rapidly and try to expand beyond the substrate that constrains them. This leads to a thermal shock, and foils that are deposited on substrates can debond, thereby causing inconsistent and less effective bonding. As the reaction proceeds, the foils will also densify, due to the change in chemical bond. This densification, can also cause debonding from a substrate and inconsistent and ineffective bonding. By making the reactive foil freestanding, debonding is prevented and the foil is easily manipulated and handled. Thus the foil is suitable for a greater variety of applications. In accordance with a preferred embodiment, the thicker reactive foils are on the order of 50 μm to 1 cm thick.

Figure 6:
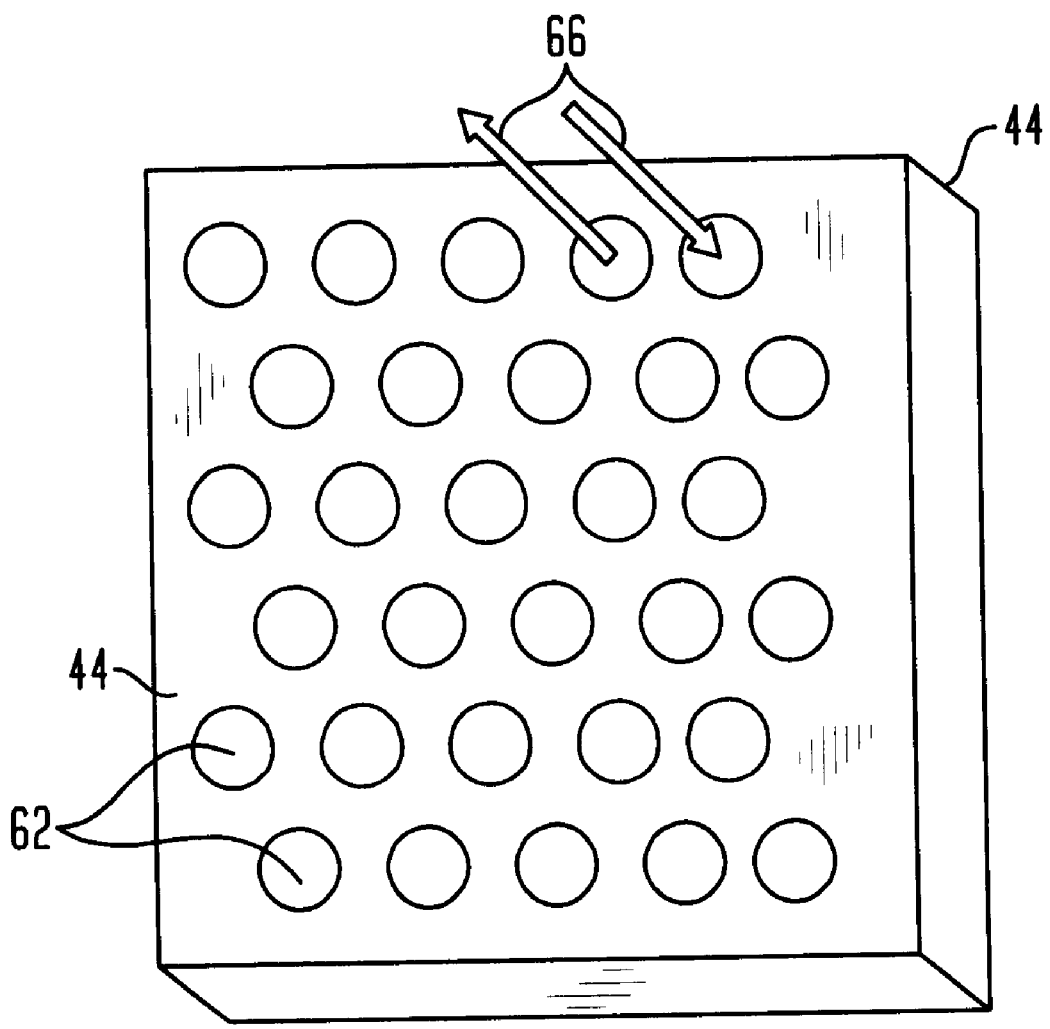
FIG. 6 illustrates an apertured freestanding multilayer reactive foil.

The foil 44 may be fabricated with one or more openings or perforations 62 through the foil structure, as shown in FIG. 6. Preferably the openings 62 are formed in a periodic pattern, such as a rectangular array, across the foil area. Any known method may be employed to create openings. For example, openings 62 may be formed photolithographically by depositing photoresist on the foil 44, patterning the photo resist, and then etching the underlying foil through the patterned holes. A further exemplary technique is to physically punch holes 62 in foil 44. Preferably the openings have effective diameters in the range of 10–10,000 micrometers. (The effective diameter of a non-circular opening is the diameter of a circular opening of equal area.)

As shown in FIG. 6, the openings in foil 44 allow joining material 52, or bulk material 50 in some circumstances, to extrude (as shown by arrows 66) through these perforations 62 upon being heated and melted by the exothermic reaction of foil 44. Upon this extrusion, one layer of joining material 52, or bulk material 50, may contact and couple with another layer 52, or bulk material 50, on the opposite side of the freestanding foil 44. The openings can also be filled with ductile metal. The patterned perforations 62 enhance bonding of bulk materials 50 to each other and to reactive foil 44, making stronger and more consistent bonds.

Utilizing one or more embodiments of the invention, a number of different applications can now be performed more effectively and efficiently. For example, metallic glass bulk materials can now be joined, where the end product is a single structure made up solely of metallic glass, including the bond and reacted foil layer. It is also now possible to join bulk materials with very different chemical compositions, thermal properties, and other physical properties, that historically presented many difficulties in bonding. Semiconductor or microelectronic devices may be bonded to circuit boards or other structures, and at the same time, multiple leads may be created that are intricately associated with the devices. Semiconductor and microelectronic devices may also be sealed hermetically.

These joining applications are enhanced by the invention in that potential for heat damage, normally associated with such applications as soldering, brazing, and welding, is avoided or at least minimized.

Moreover, utilizing reactive foils made by the process of FIG. 1, the bulk materials being joined may be freestanding. This means that prior to the actual joining of the bulk materials, the individual bulk substrates do not need any braze layer deposited directly upon them. Additionally, the bulk substrates do not require pre-bonding of the reactive foil or other pretreatment. The bulk materials involved may simply be held securely to either a freestanding braze layer or the freestanding reactive foil at the time of bonding for a strong and permanent joint to be created.

Embodiments of the invention allow bonding at least one bulk material of a metallic glass. No braze need be associated with the glass in the joining process. This is because the reactive foil may be designed to bond directly with the metallic glass upon reaction. To accomplish this joining process, the reactive foil can itself react to form a metallic glass. For further details, see Example 3 below.

Embodiments of the invention further allow for superior bonding when the bulk materials include microelectronic or semiconductor devices. In the bonding of such a device to a substrate such as a circuit board, potential for damage to the device is a factor that must be taken into consideration. By using a freestanding reactive foil to join the device to the substrate, little heat is generated that can damage the device or adjacent components. The semiconductor devices may be situated on the substrate with greater freedom and ease. Specific foil compositions, such as Ni/Al or Monel/Al, may be utilized. Foils of such composition are not only far easier to handle than those of the past, but the combination of Ni, Cu and Al enables freestanding foils to have a higher thermal and electrical conductivity.

In another embodiment reactive multilayer braze (e.g., layers of a Ni—Cu alloy alternating with layers of Al alternating with layers of a Ti—Zr—Hf alloy) may be used as joining material in conjunction with a reactive foil used in a joining application. The reactive multilayer braze would provide an additional energy source as the layers mix and form the joining material. The combination of reactive multilayer foil and reactive multilayer brazes permits the use of reactive brazes that may not self-propagate without the foil.

Figure 7A:
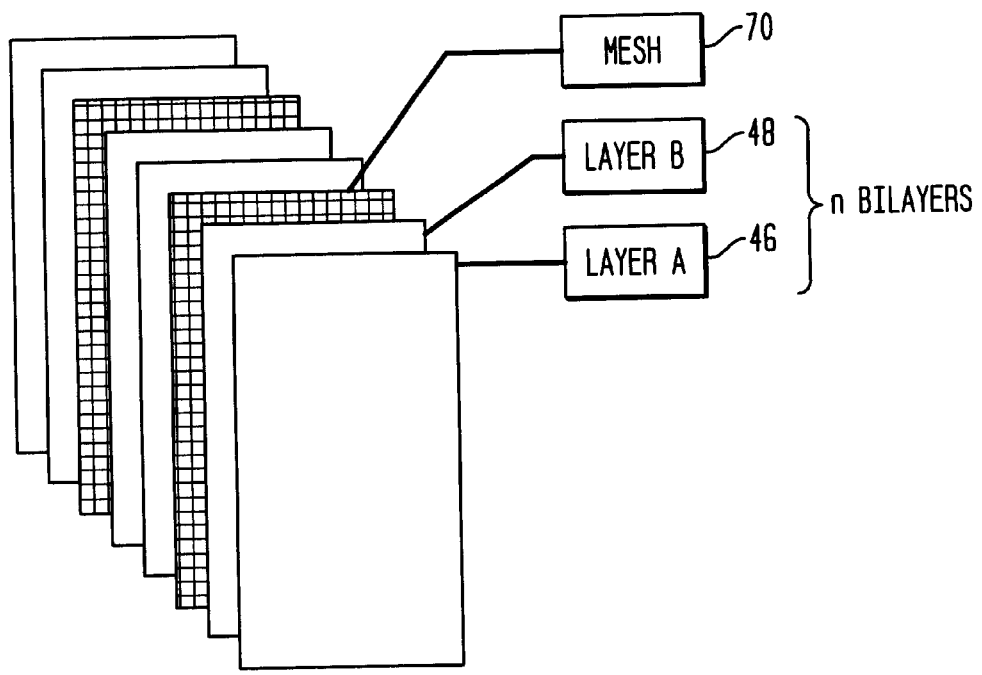
FIGS. 7A and 7B show the incorporation of ductile components into a reactive foil.
Figure 7B:
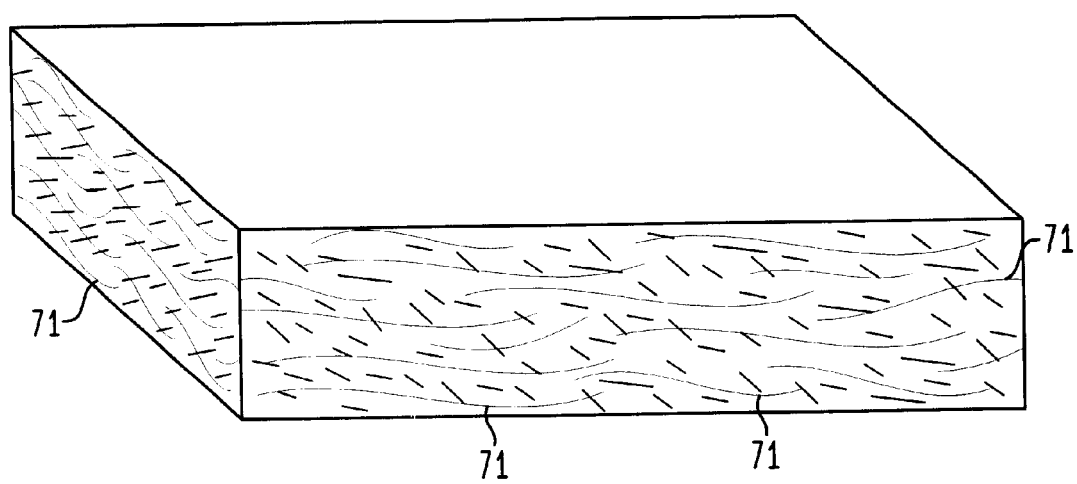

FIG. 7A is a schematic describing the process of including ductile metal inside the stack used to create the reactive foil. Ductile metal mesh screen 70 or metal powder is included between some or all of the component layers 46, 48. The stack is then processed as described in FIG. 1. FIG. 7B shows the arrangement of the resulting ductile metal stringers 71 or islands after the reactive foil is placed between two components to be bonded and subsequently reacted. The presence of such ductile islands or stringers 71 serves to arrest cracks in the generally brittle intermetallic reaction product and to improve the overall mechanical stability and reliability of the joints.

The process of FIG. 1 can also be used to fabricate multilayer foils that include oxide layers and layers of material that will exothermically reduce the oxide layers. The stack can comprise layers including formation products alternating with layers comprising reducing material. In addition to generating heat, there foils can produce a ductile reaction product that can be used as a joining material like a braze or solder. For example, foils formed by the application of the FIG. 1 process to an assembly of Al/CuOx layers will react to produce copper which acts as a joining material. See Example 2, below.

After making a thick multilayer foil by the process of FIG. 1, one can facilitate ignition of the thick layer by vapor depositing a series of relatively thinner reactive layers on the thick multilayer. In use, the thinner layers ignite more rapidly and the laterally spreading ignition vertically ignites the thicker layers. Alternatively one can make both thick and thin multilayer foils by the process of FIG. 1 and laminate them by cold rolling.

EXAMPLES

The invention may now be better understood by consideration of the following specific examples.

Example 1

Mechanical Formation of Ni/Al Multilayers

A sample was prepared by stacking alternating layers of Ni and Al foils. The stacks were then rolled and inserted into a Cu jacket, which was then repeatedly rough pumped, backfilled with Ar, and sealed. The jacketed assembly was then swaged into a smaller diameter rod and roll flattened. Some samples (before roll flattening were freed from their jacket by etching the Cu with 50% nitric acid, repacked, reswaged, and then flattened in order to achieve more deformation (smaller bilayer thickness) with the same thickness ribbon. The Cu jacket was then removed by etching and the samples were analyzed for available heat of mixing (using Differential Scanning Calorimetry), reaction velocity, mechanical properties (tensile test), and microstructure. Starting with five (100 cm by 10 cm) strips each of 12 micron Ni foil and 18 micron Al foil, the layers were stacked inalternating fashion creating a 100 cm long by 10 cm wide stack of 5 bilayers. This long strip was coiled around a 6 cm circumference rod, slipped off the end and then flattened creating a 10 cm by 3 cm stack of 200 bilayers. This stack was then rolled the short way creating a 10 cm long roll that was fit into an appropriately sized Cu tube. The tube was swaged in increments from 0.875" OD to 0.187" OD. This small rod was then cold rolled to various thicknesses ranging from 40 to 250 microns.

Figure 8:
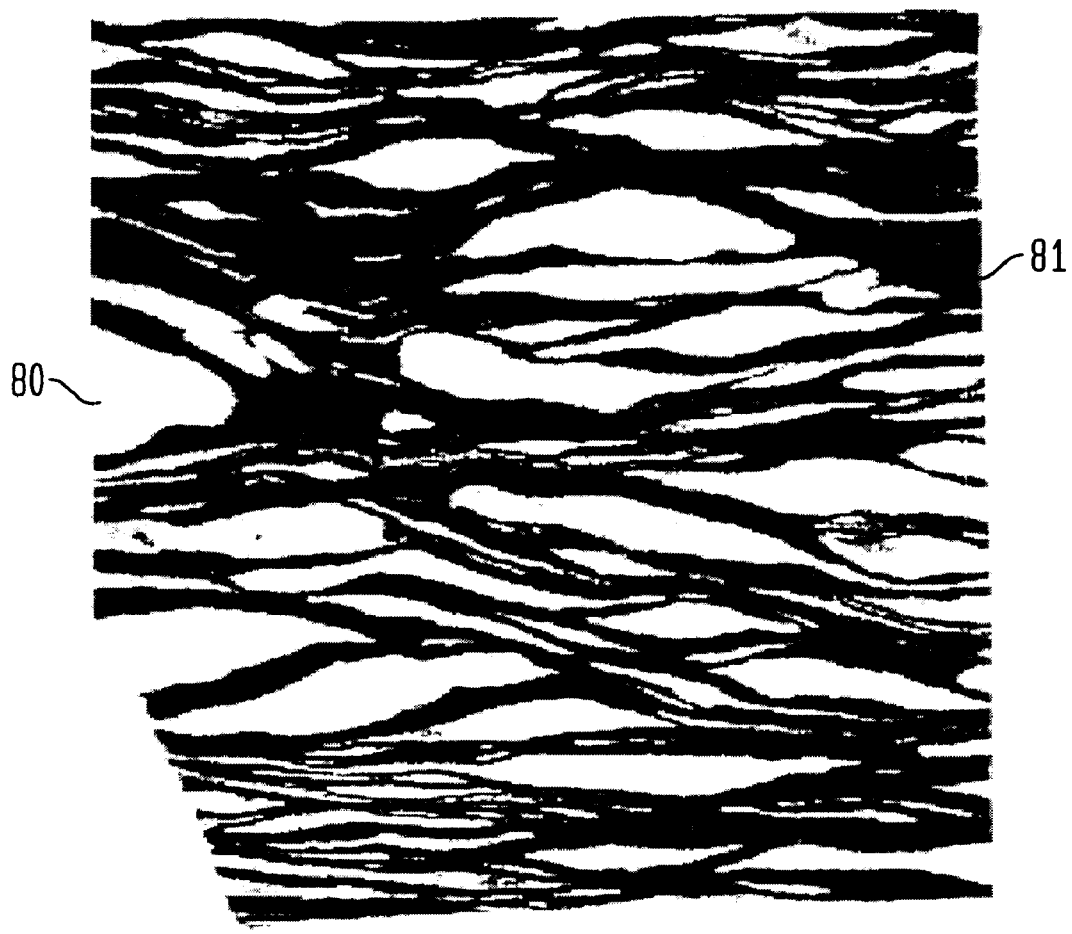
FIG. 8 depicts the microstructure of an exemplary reactive foil.

FIG. 8 is a microphotograph depicting the microstructure of the reactive foil. The presence of alternating layers of Al (80) and Ni (81) is apparent in the microstructure shown in this figure. The reactive foils thus prepared exhibited large heat generation upon ignition, which was also confirmed by differential scanning calorimetry analysis. The foils were found to be ductile and bendable allowing cutting, punching or further shaping.

The rolled reactive multilayer foils made by the process of FIG. 1 differ from vapor deposited foils in surface topography, layering, grain size, and texture. In surface topography, the rolled foils tend to have a rougher surface (rms roughness greater than 0.1 micrometer) than vapor deposited foils. In layering, the rolled foils have layers that vary considerably in thickness along the length and width of the foil. In fact, the less plastically compliant sheets (e.g. Ni) will tend to break into plates that appear in cross section like elongated particles. The plates will vary in length, width and thickness by 10 to several hundred percent. Rolled foils have grains that are elongated in the rolling direction ("pancake structure" grains). Vapor deposited foils, in contrast, tend to have grains with widths and lengths similar to or less than their thickness, where the thickness is determined by the layer thickness.

Texture refers to the crystallographic alignment of planes and directions in a crystal. In cold swaged and cold rolled foils, face centered cubic elements (FCC elements) most commonly align with their {110} planes and <112> directions parallel with the direction of deformation. Body centered cubic elements (BCC) most commonly align with the {100} planes and <110> directions parallel to the direction of deformation, and hexagonal closely packed elements (HCP) align with their {0001} planes and <2 $\underline{1}$ $\underline{1}$ 0> directions parallel to the direction of deformation.

Example 2

Mechanical Formation of Al/CuO Multilayers

The Al/CuO reaction produces nearly 3 times the heat released by the Al/Ni mixing reaction. For many applications this is too much heat, the temperatures reached during reaction are so high that much of the product vaporizes and explodes in a shower of molten metal. While this is beneficial for combustion and propulsion applications, the ideal product for bonding, for example, is one that just barely liquefies the reaction product. It thus diminishes the tendency for the product to ball up or vaporize, but still encourages wetting of the matching surfaces. Furthermore, mechanical consolidation of a metal and ceramic is typically extremely difficult. By including a diluent (up to 90% by mass), two goals are achieved. The final reaction temperature is lowered and the mechanical compatibility of the materials to be consolidated is enhanced by using this procedure.

To form such a multilayer, we begin with foil of the oxidizing reactant (in this case Al), and foil of the reduction product (in this case Cu). Next, the Cu foil is oxidized within a flowing air environment in a furnace (the environment can be modified to produce different compounds). The Cu foil is now a sandwich structure consisting of an inner layer of Cu with CuO surface coatings. The thickness and quality of the CuG coating can be controlled by modifying the furnace temperature and the time-temperature profile of the heating and cooling. Cold working of the CuO (especially when the coating is thin and not subjected to rapid temperature changes during growth) is greatly enhanced and deforms in concert with the Cu diluent. Growing the reactant (CuG) on a carrier (Cu) also allows for easier handling of the precursor material (CuO is brittle and would turn to dust upon folding or working). The Al and CuO/Cu/CuO foils can now be stacked and formed into a reactive multilayer by the process described in connection with FIG. 1. Thus one or more of the alternating layers can comprise a layer of reactant material disposed on a layer of diluent material.

Example 3

Mechanical Fabrication of Amorphous—Forming Reactive Foils

By stacking metallic sheets that comprise sheets of Al, Ni, Cu, Ti, Zr, or Hf, or alloys of Ni—Cu or Ti—Zr—Hf, and by encapsulating, swaging, and cold-rolling these stacks as described above, one can form reactive foils that will self-propagate at or near room temperature (<200° C.). These foils will react to form amorphous materials. One must be careful to maintain the stack at or below room temperature during the swaging and cold-rolling steps to minimize the loss of energy during the fabrication process. The resulting reactive foils have several useful applications:

1) Forming Bulk Metallic Glass: The as-swaged and as-rolled foils described above can be used for forming bulk metallic glass in a self-propagating manner.
2) Joining: While free-standing reactive foils in general (foils with formation reactions, foils with redox reactions, or ones that turn amorphous on reaction), can bond bulk metallic glass to another component without braze, the reactive foils described above (mechanically formed with sheets of Al, Ni, Cu, Ti, Zr, or Hf or alloys of Ni—Cu or Ti—Zr—Hf) can join metallic glass bulk materials into a single structure made up solely of metallic glass, including the bond and the reacted foil layer.
3) Reactive joining material: The reactive multilayer foil described above can also be used as a joining material in conjunction with a reactive foil used in a joining application. The reactive multilayer braze would provide an energy source as the layers mix and form the joining material, in addition to the energy provided by the reactive foil. The combination of reactive multilayer foil and reactive multilayer brazes permits the use of reactive brazes that may not self-propagate without the foil, and it permits the use of reactive multilayer foils with less total heat.

It is to be understood that the above-described embodiments are illustrative of only some of the many possible specific embodiments, which can represent applications of the principles of the invention. Numerous and varied other arrangements can be made by those skilled in the art without departing from the spirit and scope of the invention.

What is claimed is:

1. A method of fabricating a reactive multilayer foil comprising the steps of:

providing an assembly of alternating layers of materials that can exothermically react;

inserting the assembly into a jacket;

deforming the jacketed assembly to reduce its cross sectional area;

flattening the deformed jacketed assembly; and removing the jacket.

2. The method of claim 1 wherein the assembly of alternating layers comprises a stack of foil.

3. The method of claim 1 further comprising winding the assembly into a cylinder before inserting the assembly into the jacket.

4. The method of claim 3 further comprising flattening the cylinder before inserting the cylinder into the jacket.

5. The method of claim 1 wherein deforming the jacketed assembly comprises radially deforming the jacketed assembly.

6. The method of claim 5 wherein the radial deforming is by swaging, drawing or extrusion.

7. The method of claim 1 wherein flattening the deformed jacketed assembly comprises rolling.

8. The method of claim 1 wherein the jacketed assembly is maintained at a temperature below about 100° C. during the deforming.

9. The method of claim 1 wherein the jacketed assembly is maintained at a temperature below about 100° C. during the flattening.

10. The method of claim 1 wherein the jacket is removed by chemical etching.

11. The method of claim 1 wherein removing the jacket comprises shearing the jacket.

12. The method of claim 1 wherein the assembly of alternating layers of materials comprises alternating layers of metals or alloys.

13. The method of claim 1 wherein the jacket comprises metal or alloy.

14. The method of claim 1 wherein the stack of alternating layers further comprises one or more layers of joining material.

15. The method of claim 1 wherein the stack of alternating layers comprises layers including oxidation products alternating with layers comprising reducing material.

16. The method of claim 1 wherein the stack of alternating layers comprise layers including formation products alternating with layers comprising reducing material.

17. The method of claim 1 wherein the stack of alternating layers includes particles of reactants.

18. The method of claim 1 wherein the stack of alternating layers includes diluents.

19. The method of claim 1 wherein the stack of alternating layers includes mesh or powder of ductile metal between layers of the stack.

20. The product made by the method of claim 19.

21. The method of claim 1 wherein one or more of the alternating layers comprises a layer of reactant material disposed on a layer of diluent material.

22. A reactive multilayer foil comprising a deformed and laminated stack of alternating layers of materials that can exothermic ally react, the stack deformed by pressure into a sheet with the layers laminated by cold welding;

the reactive multilayer foil further comprising one or more layers of joining material adhered to the sheet.

23. A reactive multilayer foil comprising a deformed and laminated stack of alternating layers of materials that can exothermically react, the stack deformed by pressure into a sheet with the layers laminated by cold welding;

the reactive multilayer foil further comprising layers of joining material adhered to the top and the bottom of the sheet.

24. A reactive multilayer foil comprising a deformed and laminated stack of alternating layers of materials that can exothermically react, the stack deformed by pressure into a sheet with the layers laminated by cold welding;

the reactive multilayer foil further comprising a plurality of openings through the sheet, the openings having effective diameters in the range 10 to 10,000 micrometers.

25. The reactive multilayer foil of claim 24 wherein the openings are filled with ductile metal.

26. A reactive multilayer foil comprising a deformed and laminated stack of alternating layers of materials that can exothermically react, the stack deformed by pressure into a sheet with the layers laminated by cold welding;

wherein the alternating layers react by reduction-oxidation.

27. A reactive multilayer foil comprising a deformed and laminated stack of alternating layers of materials that can exothermically react, the stack deformed by pressure into a sheet with the layers laminated by cold welding;

wherein the alternating layers react by reduction-formation.

28. A reactive multilayer foil comprising a deformed and laminated stack of alternating layers of materials that can exothermic ally react, the stack deformed by pressure into a sheet with the layers laminated by cold welding;

wherein the alternating layers comprise layers of aluminum or aluminum alloy alternating with layers of copper oxide.

29. A reactive multilayer foil comprising a deformed and laminated stack of alternating layers of materials that can exothermically react, the stack deformed by pressure into a sheet with the layers laminated by cold welding;

wherein the stack of alternating layers includes diluent material that absorbs energy, thereby lowering the reaction temperature.

30. A method of bonding a first body to a second body comprising the steps of:

disposing between the first body and the second body, a free standing reactive multilayer foil comprising a deformed assembly of materials that can exothermically react, the materials laminated together by deformation;

pressing the bodies against the reactive foil; and igniting the foil.

31. An article comprising a deformed and laminated stack of alternating layers of materials that can exothermically react, the stack deformed by pressure into a sheet with the layers laminated by cold welding.

32. An article according to claim 31 further deformed by flattening the cylinder.

* * * * *